US012765337B2

(12) United States Patent
Sankaran et al.

(10) Patent No.: US 12,765,337 B2
(45) Date of Patent: Oct. 13, 2026

(54) PASSIVE COMPONENT Q FACTOR ENHANCEMENT WITH ELEVATED RESISTANCE REGION OF SUBSTRATE

(71) Applicant: TEXAS INSTRUMENTS INCORPORATED, Dallas, TX (US)

(72) Inventors: Swaminathan Sankaran, Allen, TX (US); Scott Robert Summerfelt, Garland, TX (US); Benjamin Cook, Los Gatos, CA (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 324 days.

(21) Appl. No.: 17/681,029

(22) Filed: Feb. 25, 2022

(65) Prior Publication Data

US 2022/0406649 A1 Dec. 22, 2022

Related U.S. Application Data

(60) Provisional application No. 63/213,567, filed on Jun. 22, 2021.

(51) Int. Cl.

*H10W 10/00* (2026.01)
*H10D 1/20* (2025.01)
(Continued)

(52) U.S. Cl.

CPC .......... *H10W 10/014* (2026.01); *H10D 86/85* (2025.01); *H10P 14/687* (2026.01);
(Continued)

(58) Field of Classification Search

CPC ........... H01L 21/76224; H01L 21/0212; H01L 21/76816; H01L 21/76898; H01L 27/013;
(Continued)

(56) References Cited

U.S. PATENT DOCUMENTS

| | | | |
|---|---|---|---|
| 6,258,697 | B1 | 7/2001 | Bhakta |
| 6,287,931 | B1 | 9/2001 | Chen |

(Continued)

FOREIGN PATENT DOCUMENTS

| | | | |
|---|---|---|---|
| EP | 0966040 | A1 | 12/1999 |
| JP | 2009510787 | A | 3/2009 |

(Continued)

OTHER PUBLICATIONS

International Search Report for PCT/US2022/034217 dated Oct. 13, 2022; 3 pages.

(Continued)

*Primary Examiner* — Robert G Bachner

(74) *Attorney, Agent, or Firm* — Zhenhai Fu; Charles F. Koch

(57) ABSTRACT

An integrated circuit (IC) includes a semiconductor substrate and an interconnect region. The semiconductor substrate has a first surface and a second surface opposite the first surface. The semiconductor substrate has a first region with a passive component. The semiconductor substrate has a second region outside the first region. The resistance of the second region is smaller than the resistance of the first region. The interconnection region is on the second surface of the semiconductor substrate.

31 Claims, 8 Drawing Sheets

(51) Int. Cl.

| | |
|---|---|
| ***H10D 1/68*** | (2025.01) |
| ***H10D 86/85*** | (2025.01) |
| ***H10P 14/68*** | (2026.01) |
| ***H10W 10/17*** | (2026.01) |
| ***H10W 20/00*** | (2026.01) |

(52) U.S. Cl.
CPC ......... *H10W 10/17* (2026.01); *H10W 20/023* (2026.01); *H10W 20/089* (2026.01); *H10D 1/20* (2025.01); *H10D 1/68* (2025.01)

(58) Field of Classification Search
CPC ..... H01L 28/10; H01L 28/40; H01L 23/5227; H01L 21/02271; H01L 21/02118
See application file for complete search history.

(56) References Cited

U.S. PATENT DOCUMENTS

| | | | | |
|---|---|---|---|---|
| 7,309,659 | B1 | 12/2007 | Subramanian | |
| 8,933,473 | B1 | 1/2015 | Dubin | |
| 9,419,075 | B1 | 8/2016 | Carothers | |
| 9,887,165 | B2 | 2/2018 | Pagani | |
| 10,199,461 | B2 | 2/2019 | Carothers | |
| 10,331,993 | B1 | 6/2019 | Koepp | |
| 11,423,278 | B1 | 8/2022 | Koepp | |
| 2002/0086585 | A1 | 7/2002 | Butaye | |
| 2002/0113037 | A1* | 8/2002 | Wu | H01L 21/31111 257/E21.252 |
| 2005/0133837 | A1* | 6/2005 | Hsu | H01L 27/14689 257/292 |
| 2006/0177979 | A1* | 8/2006 | Tu | H01L 21/28079 257/E21.654 |
| 2007/0075445 | A1 | 4/2007 | Gogoi | |
| 2008/0217659 | A1* | 9/2008 | Hung | H01L 27/14654 257/E27.162 |
| 2008/0258238 | A1 | 10/2008 | Rogers | |
| 2011/0175152 | A1 | 7/2011 | Booth, Jr. | |
| 2012/0267753 | A1 | 10/2012 | Yeh | |
| 2013/0264688 | A1 | 10/2013 | Qian | |
| 2014/0124845 | A1 | 5/2014 | Cheng | |
| 2014/0342527 | A1 | 11/2014 | Steeneken et al. | |
| 2014/0361401 | A1 | 12/2014 | Wang | |
| 2015/0069520 | A1* | 3/2015 | Lee | H10D 84/038 257/371 |
| 2015/0115342 | A1 | 4/2015 | Kaya | |
| 2015/0206861 | A1 | 7/2015 | Dubin | |
| 2016/0072182 | A1 | 3/2016 | Wang | |
| 2016/0218175 | A1 | 7/2016 | Carothers | |
| 2017/0117356 | A1 | 4/2017 | Carothers | |
| 2017/0125407 | A1* | 5/2017 | Schulze | H01L 27/082 |
| 2017/0345714 | A1 | 11/2017 | Scharf | |
| 2018/0123251 | A1 | 5/2018 | Wang | |
| 2018/0190580 | A1 | 7/2018 | Haba et al. | |
| 2018/0294545 | A1 | 10/2018 | Xue | |
| 2019/0157137 | A1 | 5/2019 | Desbonnets | |
| 2020/0058581 | A1 | 2/2020 | El-Hinnawy | |
| 2020/0203290 | A1* | 6/2020 | Summerfelt | H01L 21/76264 |
| 2021/0305158 | A1 | 9/2021 | Wagner | |
| 2022/0093429 | A1 | 3/2022 | Chen | |
| 2022/0223564 | A1 | 7/2022 | Chen | |
| 2023/0142196 | A1 | 5/2023 | Seol | |
| 2023/0144206 | A1 | 5/2023 | Dogiamis | |
| 2024/0006381 | A1 | 1/2024 | Morein | |

FOREIGN PATENT DOCUMENTS

| | | | |
|---|---|---|---|
| JP | 2019527925 | A | 10/2019 |
| KR | 1020070110743 | A | 11/2007 |

OTHER PUBLICATIONS

Written Opinion for PCT/US2022/034217 dated Oct. 13, 2022; 4 pages.

European Patent Office, Extended European Search report, dated Sep. 9, 2024, 7 pages.

Final Office Action in corresponding U.S. Appl. No. 17/680,981, issued Jan. 7, 2026, 15 pgs.

First Office Action in corresponding JP Application No. 2023-579135 issued Jul. 8, 2026, 6 pgs.

* cited by examiner

FIG. 1
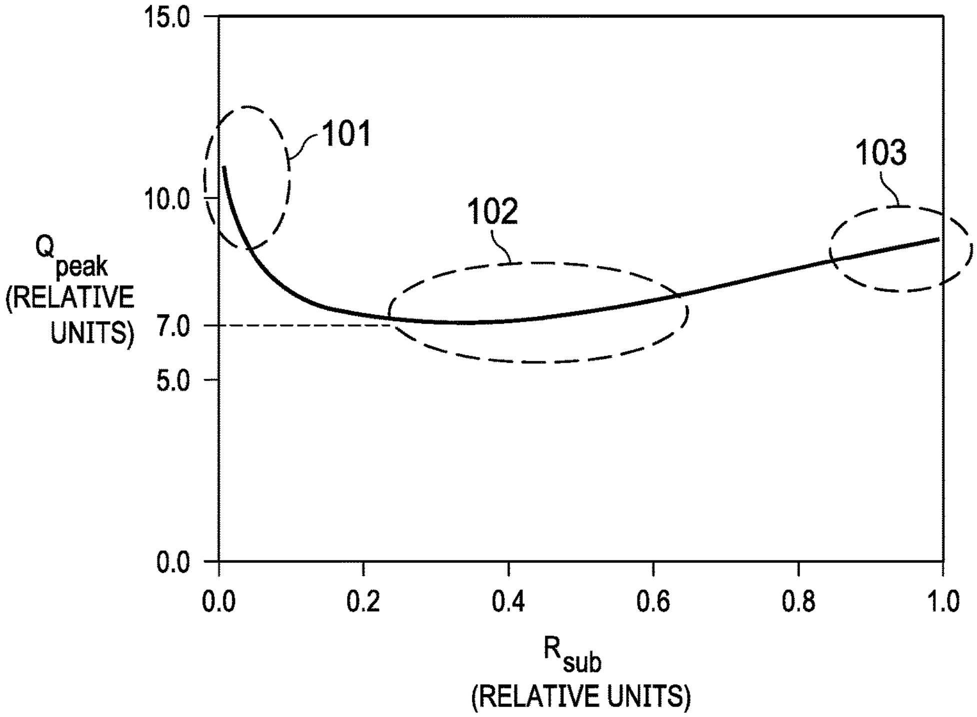
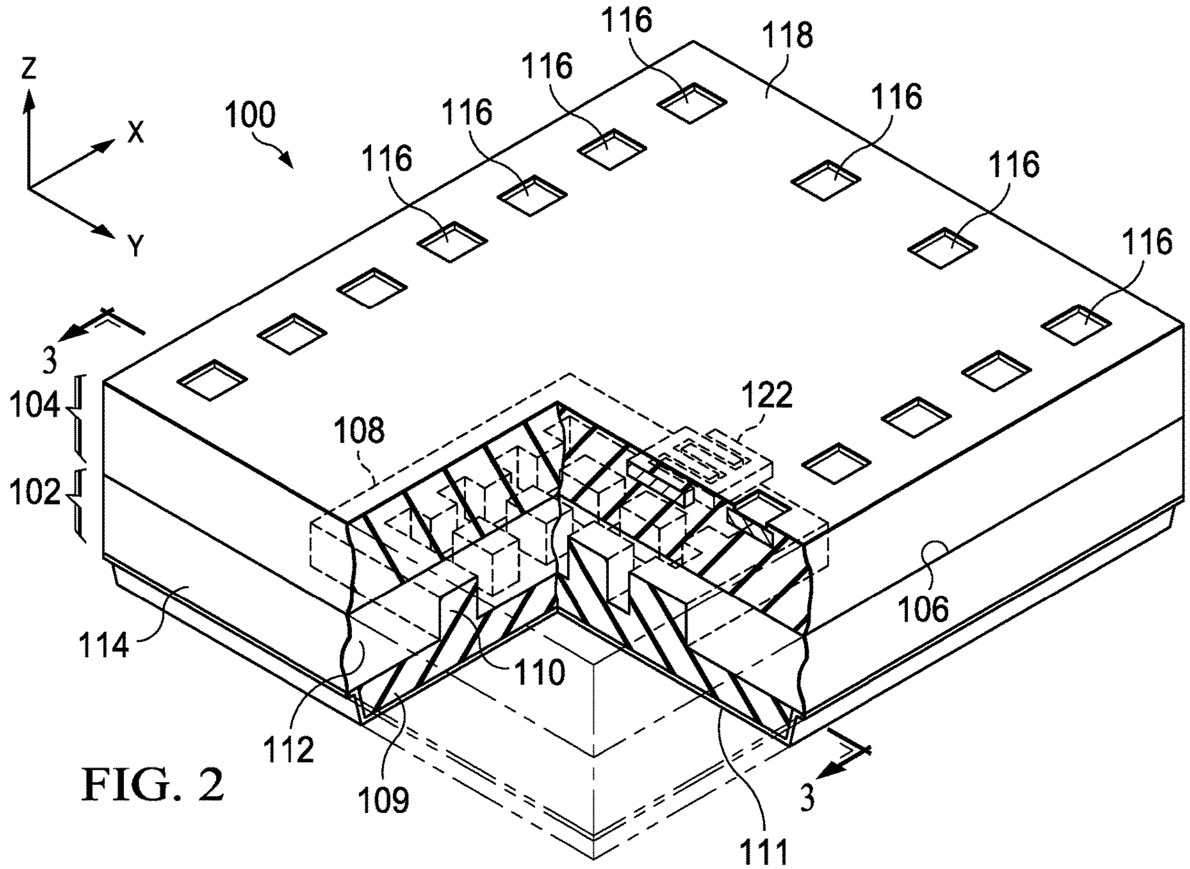
FIG. 2

PASSIVE COMPONENT Q FACTOR ENHANCEMENT WITH ELEVATED RESISTANCE REGION OF SUBSTRATE

CROSS-REFERENCE TO RELATED APPLICATIONS

This application claims priority to U.S. Provisional Application No. 63/213,567, filed Jun. 22, 2021, which is hereby incorporated by reference.

BACKGROUND

Semiconductor devices (dies, chips) include numerous types of electrical components. One type of electrical component is a passive component that has an impedance that is a function of frequency. Examples of such passive components include inductors, transformers, and capacitors.

SUMMARY

In one example, an integrated circuit (IC) includes a semiconductor substrate and an interconnect region. The semiconductor substrate has a first surface and a second surface opposite the first surface. The semiconductor substrate has a first region with a passive component. The substrate has a second region outside the first region. The resistance of the second region is smaller than the resistance of the first region. The interconnection region is on the second surface of the semiconductor substrate.

In another example, a method of fabricating an IC on a semiconductor wafer includes forming a passive component on a semiconductor substrate in a first region of the semiconductor substrate. The semiconductor substrate has a first surface and a second surface opposite the first surface. The method further includes etching, in a pattern through wafer trenches (TWTs) from the first surface of the substrate towards, but not extending all of the way to, the second surface of the substrate. The pattern at least partially overlaps the first region along an axis extending normal to the first surface. The method also includes applying a dielectric polymer in the plurality of TWT.

BRIEF DESCRIPTION OF THE DRAWINGS

For a detailed description of various examples, reference will now be made to the accompanying drawings in which:

FIG. 1 is a graph illustrating the relationship between the quality (Q) factor of a passive component and substrate resistance in accordance with an example.

FIGS. 2-4 are views of an example semiconductor device containing an isolation region formed by a through wafer trench in accordance with an example.

DETAILED DESCRIPTION

Figure 3:
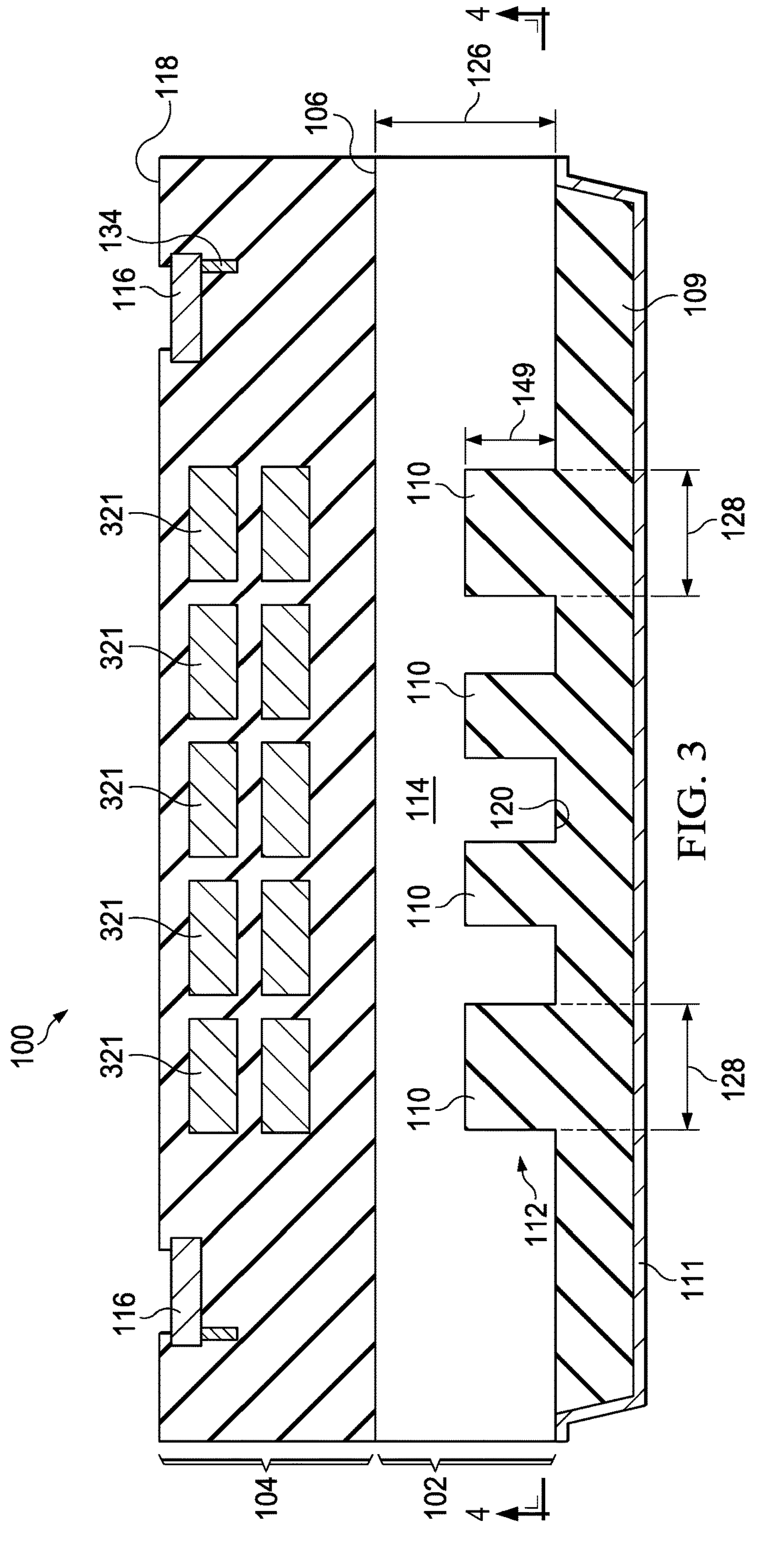

The same reference number is used in the drawings for the same or similar (either by function and/or structure) features.

A definition of the quality (Q) factor of the types of passive electrical components is the ratio of its reactive impedance to its resistance for a given frequency. The Q factor is a unitless quantity that is a measure of the passive component's efficiency. The higher the Q factor, the closer the passive component is to an ideal component (an ideal component being a component that does not convert electrical energy into heat). The Q factor of an inductor is $Q=L*\omega/Rs$, where L is the inductance, ω is frequency, and Rs is the series resistance of the inductor. The Q factor of a capacitor is $Q=1/(Rs*C*\omega)$, where Rs is the series resistance of the capacitor and C is the capacitor's capacitance. A transformer includes two inductors, each characterized by its own Q factor. It is desirable to have a higher Q factor for a passive component than a lower Q factor.

Passive components are fabricated on a semiconductor substrate (e.g., silicon). The semiconductor substrate itself is conductive. A passive component such as an inductor can induce a current in the substrate. The direction of current in the substrate is opposite the direction of current flow in the inductor. This phenomenon is characterized per Lenz's Law. This effect reduces the effective inductance of the inductor. Further, the resistance of the substrate represents an increase in the series resistance of the inductor. As the Q factor is proportional to inductance and inversely proportional to resistance, with both the effective inductance decreasing and the series resistance increasing, the Q factor of an inductor formed on a semiconductor substrate is reduced. The Q factor of a capacitor formed on a semiconductor substrate also is impaired due to similar phenomena.

FIG. 1 illustrates an example relationship between the resistance of the substrate (Rsub) on the Q factor of a passive component. As FIG. 1 shows, the Q factor is higher for lower resistance substrates (identified at 101) as well as for higher resistance substrates (identified at 103). However, most or many substrates have resistances in the middle range identified by 102 in FIG. 1. In substrate resistance range 102, the Q factor of a passive component formed on such a substrate is lower. The lowest Q factor in the example curve in FIG. 1 is 7.0, but at higher substrate resistances (e.g., in the range 103), the Q factor is higher (e.g., 8-9).

The embodiments described herein are directed to a substrate that is back-side etched to form trenches below the area in which a passive component is located. The trenches are filled with a dielectric material. By including higher resistance dielectric material in the area of the substrate below a passive component, the resistance of the substrate in that area is increased relative to the substrate in absence of dielectric-filled trenches. As a result, the effective resistance of the substrate near the passive component is increased from the range 102 to the range 103 and thus the Q factor of the passive component(s) in that area advantageously is increased. While examples are described herein pertaining to bulk semiconductor technology, other examples of this description include silicon-on-insulator (SOI)-based semiconductor technology.

As is described in detail herein, a semiconductor device including one or more passive components is formed on a semiconductor substrate. An interconnect region containing contacts and metal lines and possibly vias is formed on a top surface of the substrate. Trenches are etched partially through the substrate of the integrated circuit (IC) and filled with a polymer dielectric to increase the resistance of the substrate in the region of the trenches. The trenches are referred to as "through wafer trenches" (TWTs) and are formed in area of the substrate below one or more passive components. The area of the substrate in which the dielectric-filled TWTs are formed at least partially overlaps the region of the substrate in which the passive component resides along an axis extending normal to the surface of the substrate. In one example, the trenches are formed in a grid pattern, but can be formed in other patterns as well.

Figure 4:
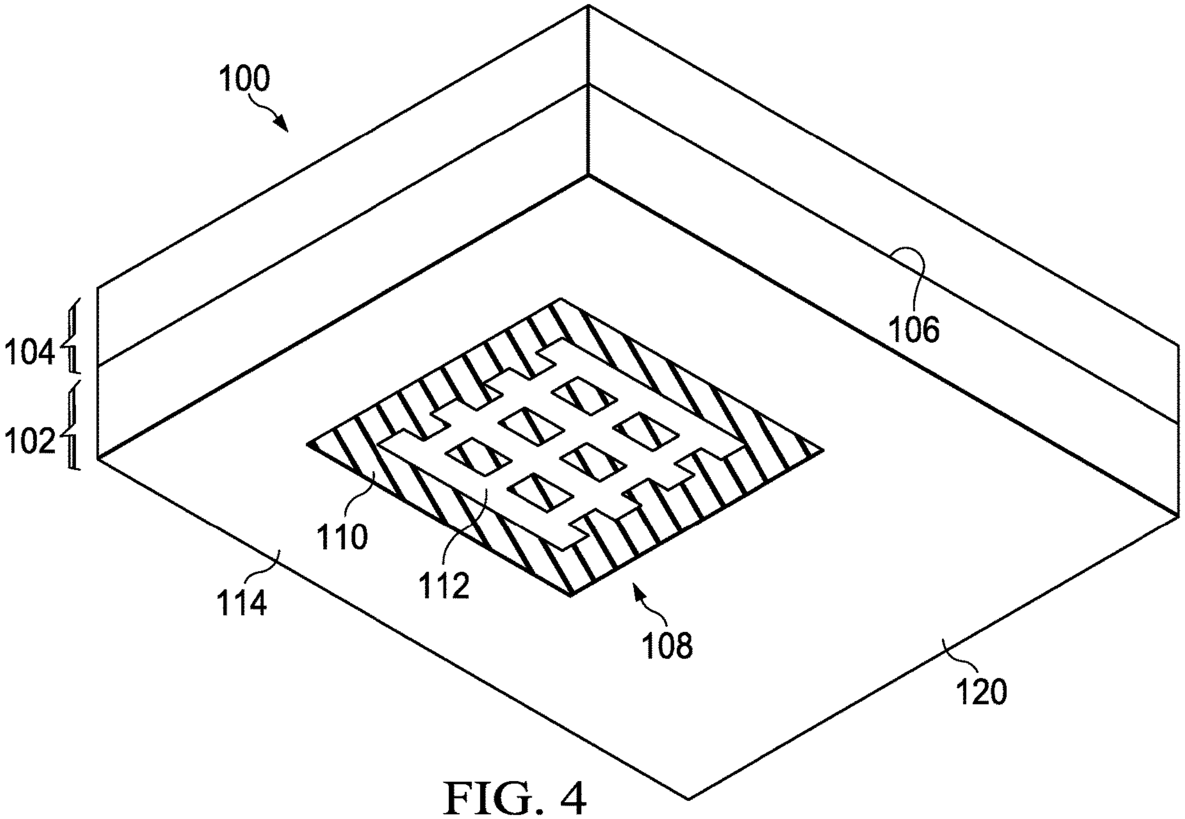

FIGS. 2-4 are views of an example semiconductor device 100 that has a substrate 102 and an "elevated" resistance region 112 formed by through wafer trenches 108 filled with a dielectric material 110. The resistance of region 112 being elevated refers to the resistance of region 112 being greater than the resistance of the substrate 102 outside region 112. In this example, the elevated resistance region 112 is below a passive component 122 (e.g., a capacitor in this exampkle). Being "below" the passive component 122 means that along the z-axis (the axis normal to the surface 106, FIG. 3, of the substrate 102) the elevated resistance region 122 has a footprint that at least partially overlaps the area in which the passive component is located.

FIG. 2 is a top perspective view of semiconductor device 100. The substrate 102 may be from a bulk semiconductor wafer and may include an epitaxial layer of semiconductor material. The semiconductor device 100 includes an interconnect region 104 at the top surface 106 of the substrate 102. The interconnect region 104 includes layers of dielectric material, one or more levels of metal lines, contacts connecting the metal lines to components in the substrate 102, and vias connecting the metal lines of different levels.

Elevated resistance region 112 is a portion of the substrate 102 in which through wafer trenches 108 are formed by removing the semiconductor material from the substrate 102 and replacing the lower resistance semiconductor material with a higher resistance dielectric fill material 110. A primary portion 114 of the substrate 102 is outside of elevated resistance region 112 and abuts the elevated resistance region 112. In this example, due to the presence of the higher resistance dielectric fill material 110 in the TWTs 108 of region 112, the primary portion 114 has a lower resistance than the elevated resistance region 112. A backside dielectric layer 109 is continuous over the elevated resistance region 112 and a portion of primary portion 114.

In this example, a diffusion barrier 111 overlies and seals the backside dielectric layer 109. In some cases, the diffusion barrier 111 is an insulator. In these cases, the backside dielectric may not cover all of the elevated resistance region 112. The interconnect region 104 may be continuous over the elevated resistance region 112. The interconnect region 104 has a top surface 118 at an opposite face of the interconnect region 104 from the top surface 106 of the substrate 102. In this example, the semiconductor device 100 includes bond pads 116 at the top surface 118 of the interconnect region 104. While a single passive component 122 is illustrated within elevated resistance region 112 for clarity, more than one passive component may be located there as well. Further, the substrate 102 may have multiple elevated resistance regions 112, each being adjacent one or more passive components.

FIG. 3 is a cross section through the semiconductor device 100. Multiple passive components 321 are shown in layer 104 above the TWTs 108. Elevated resistance region 112 extends from a bottom surface 120 of the substrate 102 partially through wafer substrate 102 towards, but not extending all of the way to, the interconnect region 104. The dielectric fill material 110 substantially fills the TWTs 108 and forms the continuous backside layer 109. In one example, the dielectric fill material is fluorinated parylene (parylene-F or -HTC or -AF4). In other examples, the dielectric fill material may be a non-fluorinated parylene compound. In other examples, the dielectric fill material may include organic dielectric material such as epoxy, polyimide, silicone, Teflon, or benzocyclobutene (BCB). Alternatively, the dielectric fill material 110 may include inorganic dielectric material such as glass, ceramic or silicon dioxide-based inorganic material formed from siloxane-containing solution or sol-gel.

In this example, a moisture diffusion barrier 111 is formed over backside dielectric layer 109. As described in more detail hereinbelow, the dielectric properties of parylene can be improved by heating to drive out moisture and then sealing with diffusion barrier 111 to prevent absorption of moisture. In this example, diffusion barrier 111 is a layer of silicon nitride (SiN). In other examples, other types of material may be used for oxygen/moisture diffusion barrier 111, such as silicon oxynitride (SiOxNy), aluminum oxide (AlOx), etc. The moisture diffusion barrier 111 can also be a metal such as Ta, Ti, TiW, TaN, TiN, Al, Cu, Ag, or Au or other interconnect or package metal systems. The metal provides a good moisture barrier and also is a good thermal conductor.

A passive component 122 is adjacent the elevated resistance region 112 of the substrate 102. While a single passive component 122 is illustrated for clarity, additional passive (and active) components may be located within isolated portion 112. The dielectric fill material 110 in the TWTs 108 functions to increase the resistance of the substrate 102 in the area of the passive component, which results in the resistance of that area being higher (than would have been the case without the dielectric material filling the TWTs 108). The resistance of this area of the substrate is increased to range 103 in FIG. 1 thereby resulting in an increase in the Q factor of the passive component.

A thickness 126 of the substrate 102 may be in the range of, for example, 200 microns for a thinned substrate 102 to 600 microns for a full-thickness substrate 102. The height 149 of the TWTs 108 is less than the thickness 126 of the substrate. The width 128 of each TWT 108 may be, for example, 5 microns to 50 microns. Contacts 130, metal lines 132 and vias 134 in the interconnect region 104 provide electrical connections to the passive component 122 and to the bond pads 116.

Figure 5:
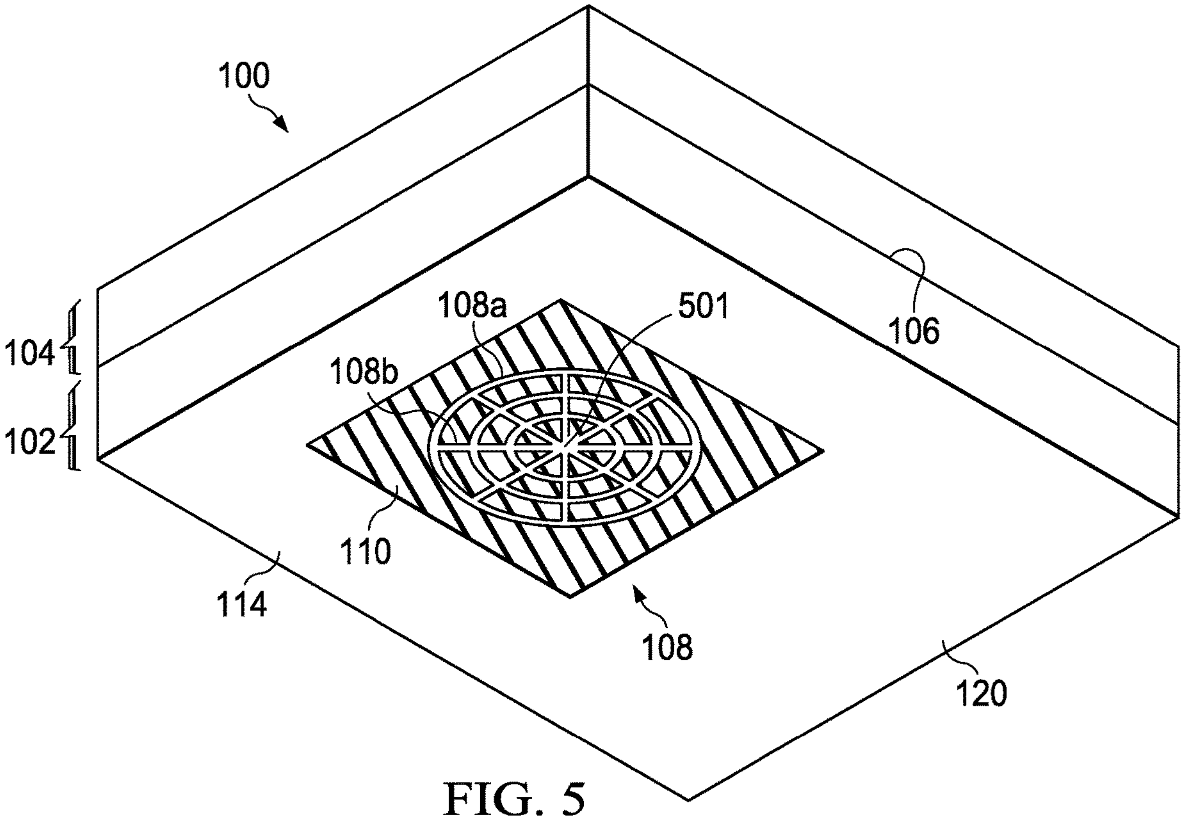
FIG. 5 is an example of through wafer trenches formed in pattern comprising concentric circular trenches.

FIG. 4 is a back-side cross-sectional perspective view of the semiconductor device 100. The elevated resistance region 112 of the substrate 102 is formed in this example as a grid pattern having orthogonally arranged trenches 108. In other embodiments, the elevated resistance region 112 is formed in other arrangements such as the pattern depicted in FIG. 5. In FIG. 5, the pattern of the elevated resistance region 112 is formed as a series of concentric circular trenches *108a* with radial trenches *108b* extending outward from the center 501.

The semiconductor device 100 may be packaged in any of a variety of package types such as, for example, a quad flat no-leads package. Flat no-leads packages such as quad-flat no-leads (QFN) and dual-flat no-leads (DFN) physically and electrically connect integrated circuits to printed circuit boards. Flat no-leads, also known as micro leadframe (MLF) and SON (small-outline no leads), is a surface-mount technology, one of several package technologies that connect ICs to the surfaces of printed circuit boards (PCBs) without through-holes. Flat no-lead is a near chip scale plastic encapsulated package made with a planar copper leadframe substrate. Perimeter lands on the package bottom provide electrical connections to the PCB. Other examples may be packaged using other known or later developed packaging technologies, such as a quad-flat package, a ball grid array, etc.

FIGS. 6A-6K are cross-sectional views of a portion of a semiconductor wafer 600 illustrating process steps for fabrication of semiconductor device 100 having at least one elevated resistance region formed by etching trenches and then filling the trenches with a dielectric material to increase the resistance of a portion of the substrate and thus to increase the Q factor of nearby passive components. As described in more detail hereinbelow, the backside layer of dielectric polymer is patterned and removed from the cut-lines between devices on the semiconductor wafer. A diffusion barrier is then applied over the remaining backside layer of dielectric polymer. In this manner, the remaining backside layer of dielectric polymer is not exposed when the semiconductor devices are separated.

Figure 6A:
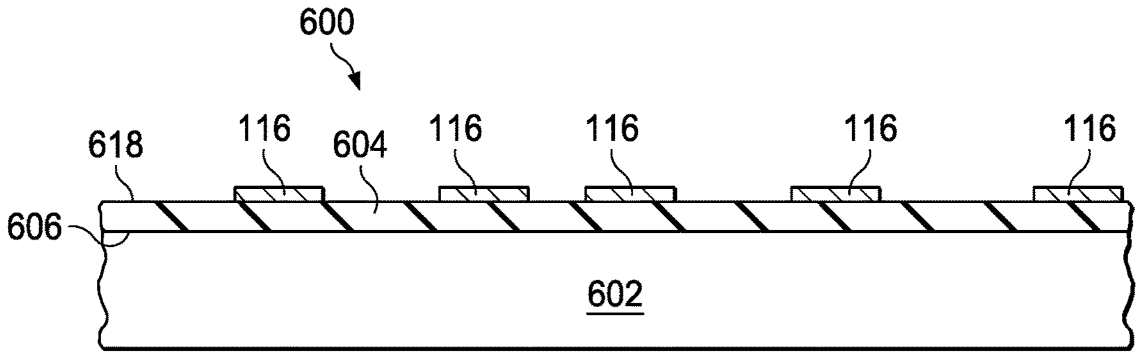
FIGS. 6A-6K are cross-sectional views of a portion of a wafer illustrating process steps for fabrication of the through wafer trench in accordance with an example.

Referring to FIG. 6A, the semiconductor device 100 (see FIG. 6K) is formed on wafer 600 that has a substrate 602 comprising a semiconductor material such as silicon. In this example, the substrate 602 is a bulk semiconductor wafer 600 containing semiconductor devices 100 (each semiconductor device 100 including one or more passive devices). The substrate 802 may include an epitaxial layer of semiconductor material. The semiconductor device 100 includes an interconnect region 604 formed at a top surface 606 of the substrate 602. The interconnect region 604 includes layers of dielectric material, one or more levels of metal lines, contacts connecting the metal lines to components in the substrate 602, and possibly vias connecting the metal lines of different levels. In this example, the semiconductor device 100 includes bond pads 116 at, or proximate to, a top surface 618 of the interconnect region 604.

Figure 6B:
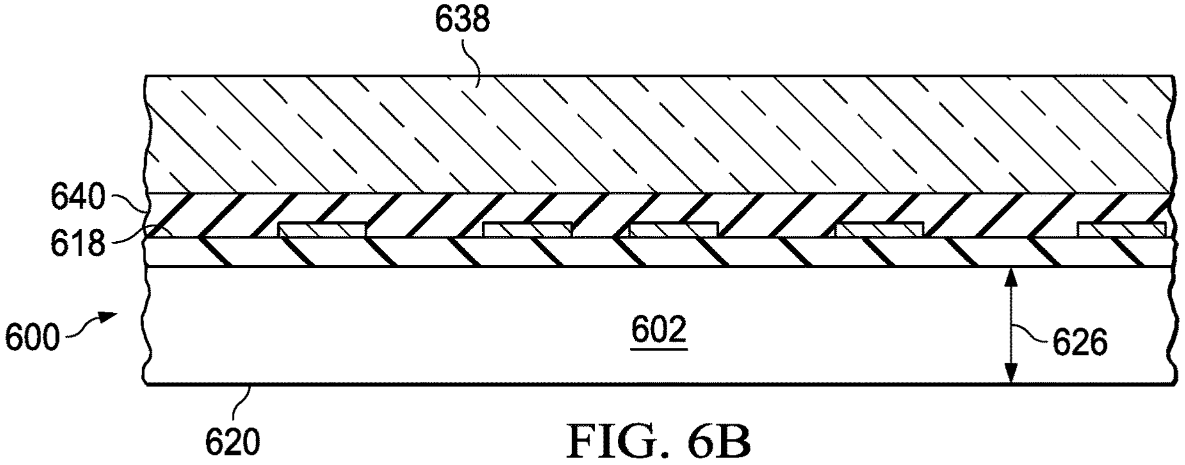

Referring to FIG. 6B, semiconductor wafer 600 is mounted on a carrier 638 with the top surface 818 of the interconnect region 604 nearest the carrier 638 and a bottom surface 620 of the substrate 602 exposed. The carrier 638 may be, for example, a silicon wafer or a ceramic or glass disk. The semiconductor wafer 600 may be mounted to the carrier 638 with a temporary bonding material 840 such as Brewer Science WaferBOND® HT-10.10. A thickness 626 of the substrate 602 may initially be 500 microns to 600 microns, for example a full thickness of a commercial silicon wafer.

Figure 6C:
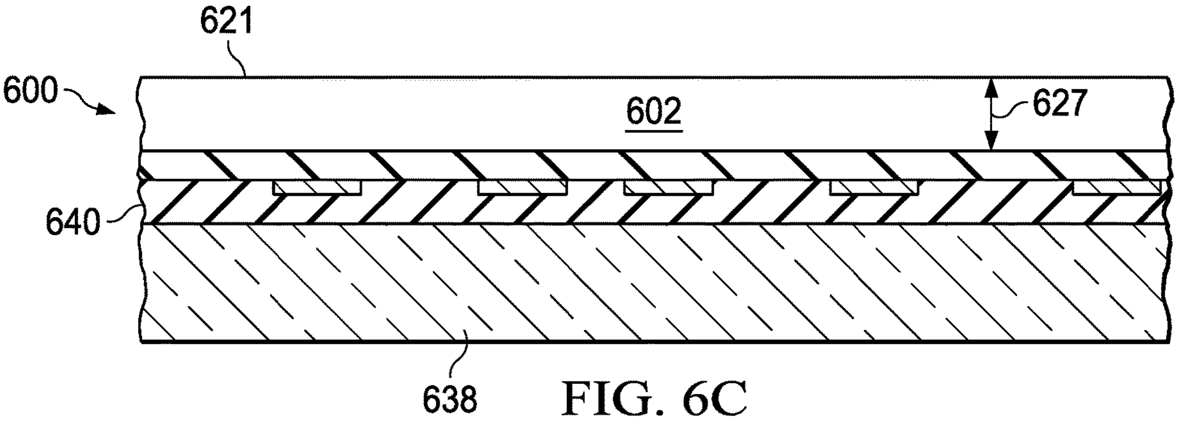

Referring to FIG. 6C, the thickness 627 of substrate 602 is reduced to approximately 100 microns, resulting from thinning the substrate 602, for example by backgrinding. The exposed surface 621 of substrate 602 may then be polished using known or later developed techniques, such as chemical mechanical polishing (CMP). Other values of the thickness 626, 627 of the substrate 602 are within the scope of this example.

Figure 6D:
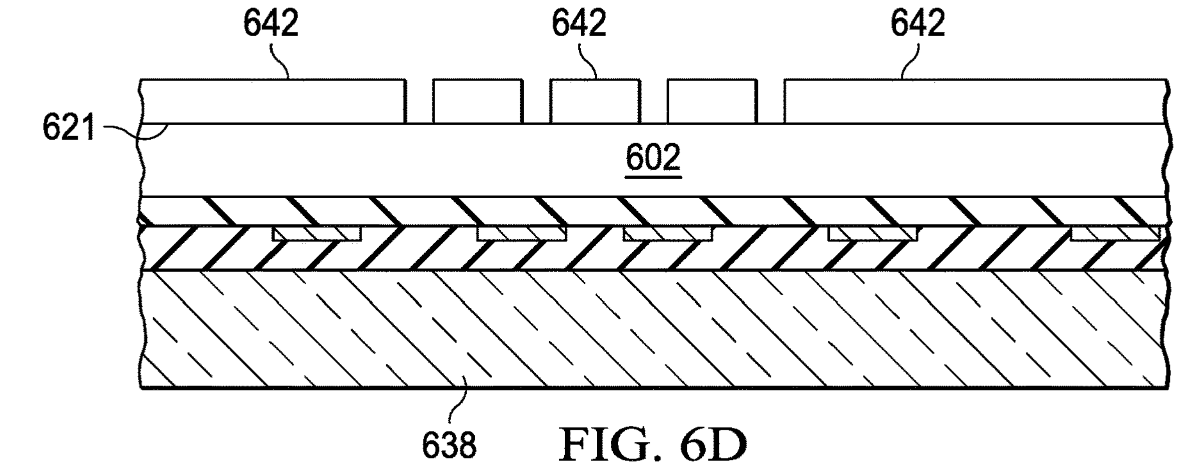

Referring to FIG. 6D, a TWT mask 642 is formed at the bottom surface 621 of the substrate 602 to expose an area for the TWTs 108. In an example, the TWT mask 642 includes, for example, photoresist formed by a photolithographic process. Forming the TWT mask 642 of photoresist has an advantage of low fabrication cost and may be appropriate for thinned substrates 602. In another example, the TWT mask 642 includes a hard mask material such as silicon nitride, silicon carbide or amorphous carbon, formed by a plasma enhanced chemical vapor deposition (PECVD) process. Forming the TWT mask 642 of hard mask material has an advantage of durability and dimensional stability and may be appropriate for full-thickness substrates 602. The TWT mask 642 has a pattern that corresponds to the grid (or other) pattern of the TWTs for the elevated resistance region 112.

Figure 6E:
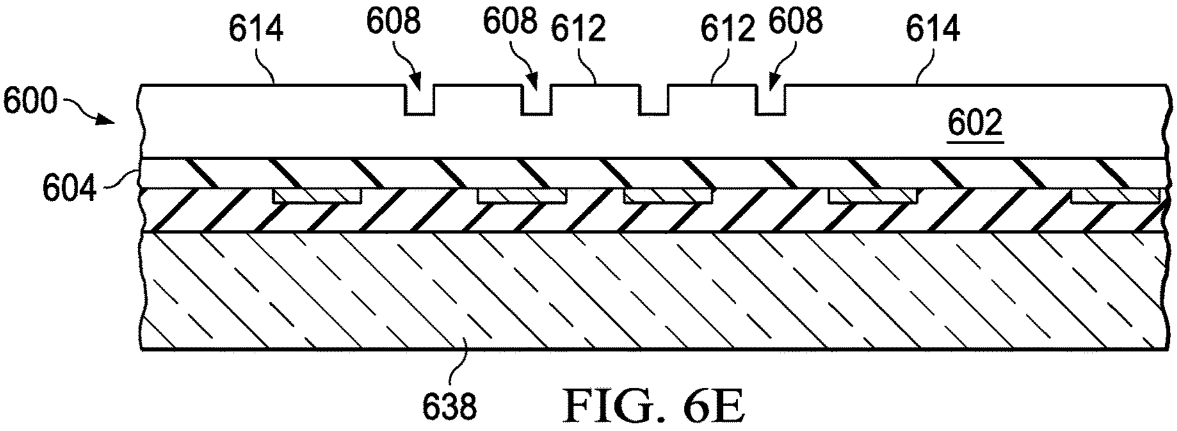

Referring to FIG. 6E, semiconductor material of the substrate 602 is removed in the areas exposed by the TWT mask 642 to form the trenches 108 to subsequently be filled with the dielectric fill material. The semiconductor material of the substrate 602 may be removed by a deep reactive ion etch (DRIE) process. One example of a DRIE process, referred to as the Bosch process, alternatively removes material at a bottom of an etched region and passivates sidewalls of the etched region, to maintain a desired profile of the etched region. Another example is a continuous DRIE process which simultaneously removes material at a bottom of an etched region and passivates sidewalls of the etched region. Trenches 608 are formed which extend partially through the substrate 602 towards the interconnect region 604. In the case of bulk-wafer processing (that does not include a silicon-on-insulator (SOI) layer), the etch process automatically stops when it reaches the interconnect region 604. In the case of an SOI process, the etch process automatically stops when it reaches a dielectric layer within the SOI structure.

Referring still to FIG. 6E, the TWT mask 642 of FIG. 6D is removed. Photoresist in the TWT mask 642 may be removed by an ash process or an ozone etch process, followed by a wet clean process. Hard mask material in the TWT mask 642 may be removed by a plasma etch process which is selective to the semiconductor material in the substrate 802 and the dielectric layers in the interconnect region 804.

Figure 6F:
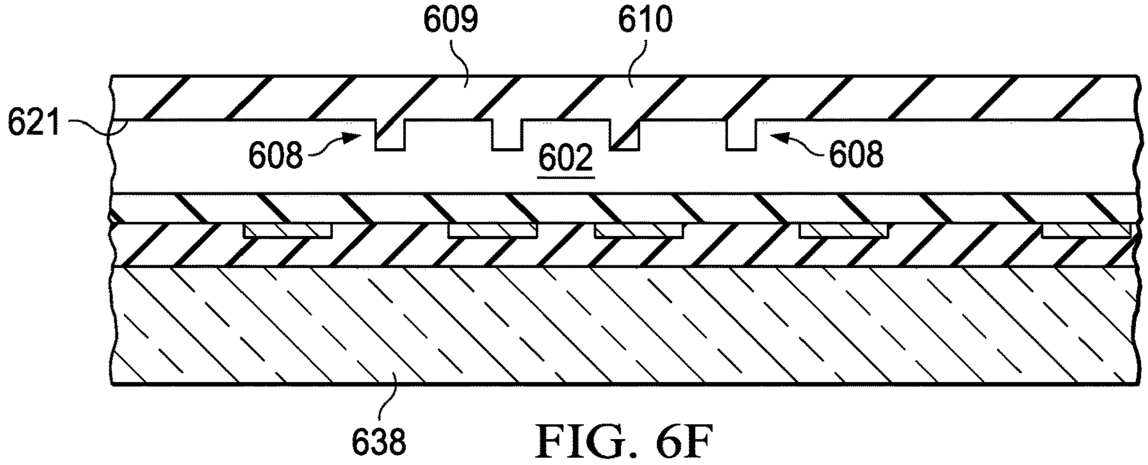

Referring to FIG. 6F, a dielectric polymer 610 is deposited into the TWTs 608 and onto backside surface 621 of substrate 602 to form a backside dielectric polymer layer 609. In this example, parylene-F is the dielectric polymer 610. In another example, parylene-HT or parylene-AF4 may be used. Parylene's deposition process eliminates the wet deposition method used for other dielectric materials such as epoxy, silicone, or urethane. It begins in a chemical-vacuum chamber, with raw, powdered parylene dimer placed in a loading boat, and inserted into a vaporizer. The dimer is initially heated to between 100 degrees C. to 150 degrees C., converting the solid-state parylene into a gas at the molecular level. The process requires consistent levels of heat; the temperature should increase steadily, ultimately reaching 680 degrees C., sublimating the vaporous molecules and splitting it into a monomer.

The vaporous molecules are then drawn by vacuum onto substrate 602 in the coating chamber, where the monomer gas reaches a final deposition phase, a cold trap. Here, temperatures are cooled to levels sufficient to remove any residual parylene materials pulled through the coating chamber from the substrate, between −90 degrees and −120 degrees C.

Parylene's complex and specialized vapor-phase deposition technique ensures that the polymer can be successfully applied as a structurally continuous backside dielectric polymer layer 609 while being entirely conformal to the characteristics of TWT region(s) 608 that are formed in substrate 602.

In another example, TWTs 608 and backside dielectric layer 609 may be formed with other types of dielectric material, such as fluid droplets containing uncured epoxy, uncured polyimide, uncured BCB, ceramic slurry, sol-gel, siloxane-containing fluid such as methyl-silsesquioxane (MSQ), or glass. The dielectric-containing fluid droplets may include solvent or other volatile fluid, which is subsequently removed. The dielectric-containing fluid droplets may include two reactive component fluids, such as epoxy resin and hardener, which are mixed just prior to delivery from a droplet delivery apparatus. The dielectric-containing fluid in the TWTs 608 is cured, dried or otherwise processed, as appropriate, to form the dielectric material 610 in the TWTs 808 and backside dielectric layer 609. The semiconductor wafer 600 may be, for example, baked in a vacuum or inert ambient to convert the dielectric-containing fluid into dielectric material 610. Some of these materials can use nano-size particles which will densify at low temperatures. In some cases, a low temperature glass powder might be used and then heated hot enough to melt and hence densify and fill gaps.

Figure 6G:
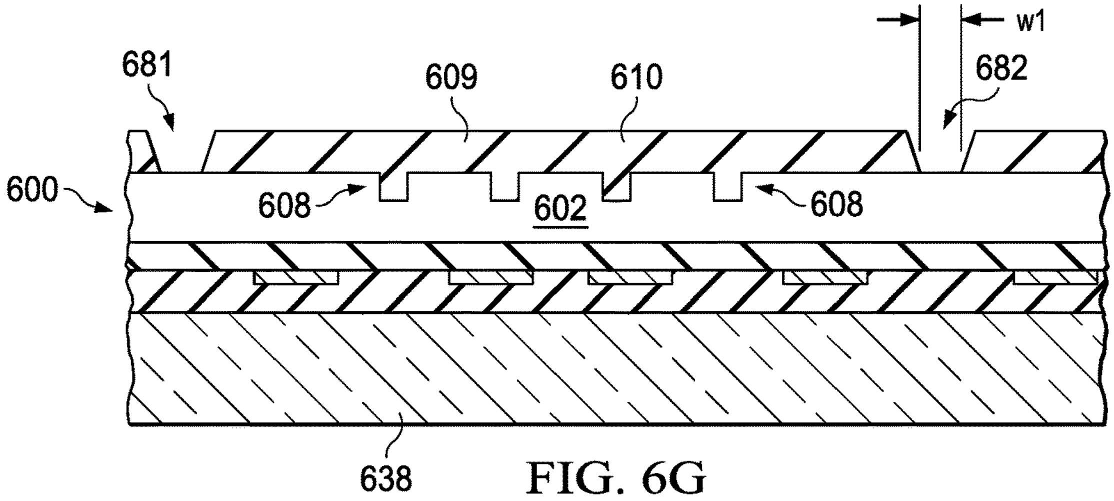

Referring to FIG. 6G, backside dielectric polymer layer 609 is processed to remove the parylene from cut-line regions 681, 682 that will be sawn or otherwise cut to separate the various devices 100 from each other. One reason to remove the parylene from the cut line regions is to keep it from interfering with the cutting process. Another reason is to allow a diffusion barrier 611 (see FIG. 6H) to be placed on the backside dielectric layer 609 that will not expose parylene backside layer 609 by the cutting process. In this example, the edges of backside dielectric layer 609 at cut-line regions 681, 682 are tapered slightly to allow a smooth deposition of diffusion barrier layer 611 (FIG. 6H).

Referring still to FIG. 6G, in one example a thick photoresist formed by a photolithographic process and a polymer etch using oxygen is used to remove the parylene from cut lines 681, 682. In another example, a hard mask material such as silicon nitride, silicon carbide or amorphous carbon formed by a plasma enhanced chemical vapor deposition (PECVD) process is used to remove parylene from cut line regions 681, 682. In another example, a laser ablation process is used to remove parylene from cut line regions 681, 682.

Figure 6H:
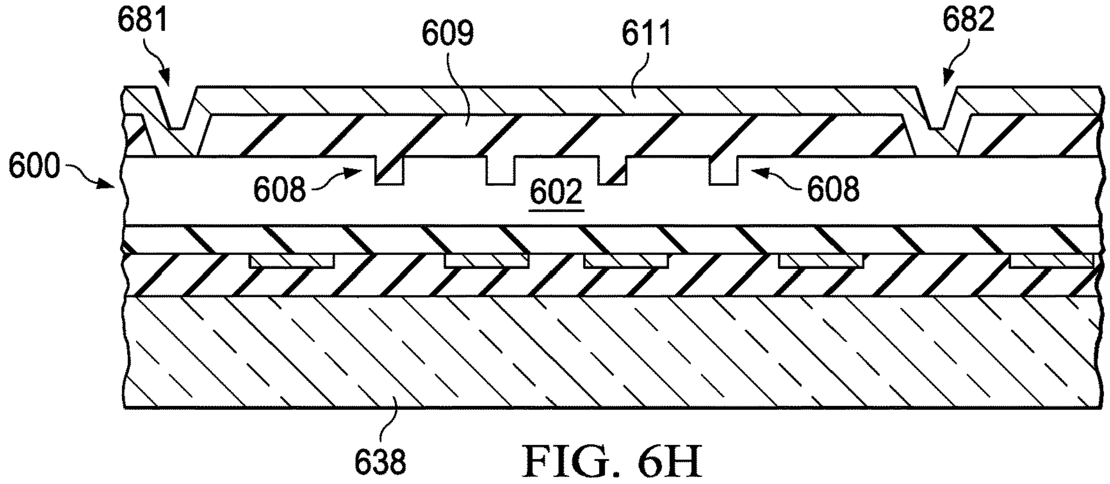

Referring to FIG. 6H, a diffusion barrier layer 611 is deposited over backside dielectric polymer layer 609. In one example, diffusion barrier layer 611 is a layer of SiN that is thick enough such that the CTE mismatch with parylene layer 609 does not crack diffusion barrier 611. In another example, diffusion layer 611 is a metal diffusion barrier. Some examples of typical interconnect or packaging metals include Ta, Ti, TiW, TaN, TiN, Al, Cu, Ag, or Au. In this case, copper (Cu), for example, is electroplated onto an adhesion layer Cu seed layer on top of a titanium (Ti) or titanium tungsten (TiW) barrier layer using a sputter, e-beam, CVD or later developed plating technique. In some examples, a pattern may be used to deposit thick Cu only in areas of dielectric polymer layer 609 that need to be protected from moisture absorption.

Prior to depositing diffusion barrier 611, parylene 610 is baked to remove any latent moisture and to densify the parylene. Removing moisture from parylene may improve its resistivity by a factor of, for example, 100 times. The resistivity of the parylene typically requires lower temperatures for long times (such as 250 degrees C. for 24 hour) or higher temperatures for short times (400 degrees C. for 1 hour). Further baking typically improves the resistivity although too much baking especially in oxygen environments may result in degradation. After baking, diffusion barrier 611 should be applied in a timely manner to prevent diffusion of moisture back into the parylene 610.

Figure 6I:
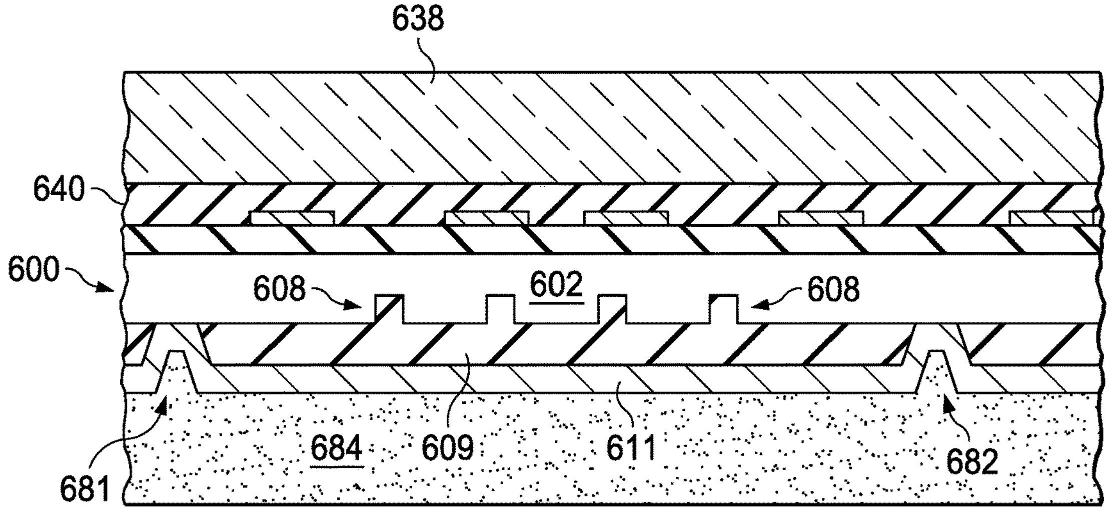

Referring to FIG. 6I, semiconductor wafer 600 is mounted on tape 684 to provide support while carrier 638 is removed. Tape 684 is a known or later developed tape that is used in the fabrication of ICs.

Figure 6J:
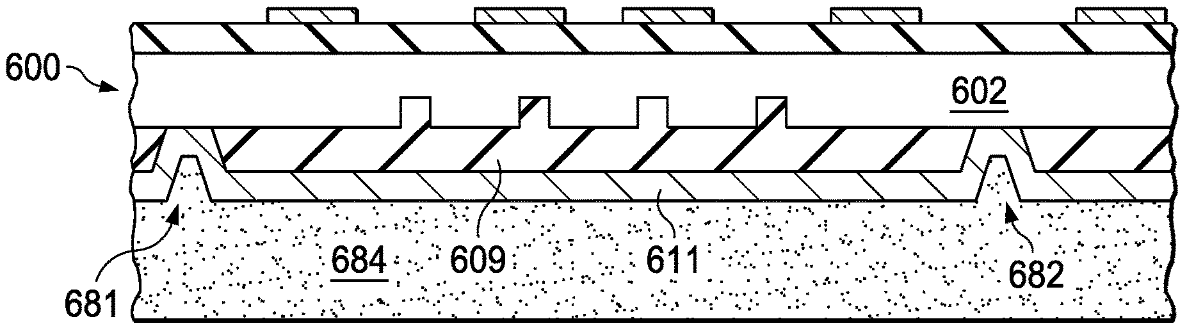

Referring to FIG. 6J, semiconductor wafer 600 is removed from the carrier 638 of FIG. 6I. The semiconductor wafer 600 may be removed, for example, by heating the temporary bonding material 640 of FIG. 681 to soften the temporary bonding material 640 using a laser or other heat source, and laterally sliding the semiconductor wafer 600 off the carrier 638. The temporary bonding material 640 is subsequently removed, for example by dissolving in an organic solvent.

Figure 6K:
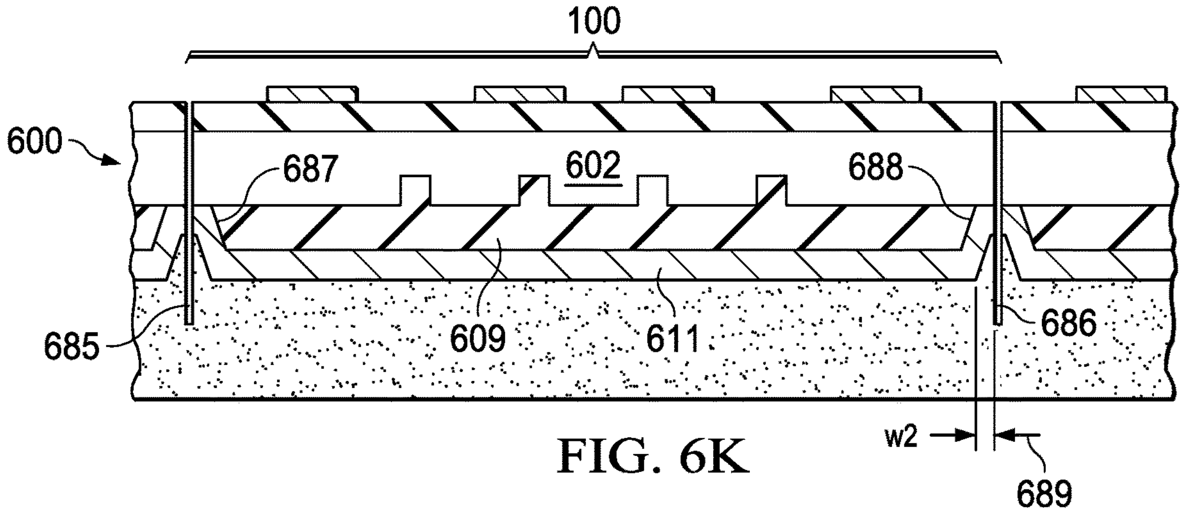

Referring to FIG. 6K, the multiple semiconductor devices 100 included on semiconductor wafer 600 are singulated as indicated at example cut lines 685, 686 using known or later developed singulation techniques, such as mechanical sawing, laser cutting, etc. Many additional cut lines (not shown) are formed to singulate all the semiconductor devices 100 that were fabricated in parallel on wafer 600.

Referring still to FIG. 6K, edges of backside dielectric polymer 687, 688 are not exposed by the singulation process and diffusion barrier 611 remains intact to completely seal and protect backside dielectric layer 609 due to the removal of a portion of the backside dielectric layer 609 in cutline region 681, 682 (FIG. 6G) prior to deposition of diffusion barrier 611. Referring to FIG. 6G, the portion of parylene that is removed from cut-line region 681, 682 has a width w1 that is wide enough so that after diffusion barrier layer 611 is applied, there is still a space 889 having a width w2 between the edge of backside dielectric layer 609 and the peripheral edge substrate 602 of IC 100 that is wide enough so that edges 687, 688 of backside dielectric polymer layer 609 are not exposed by the singulation process. Referring still to FIG. 6K, each of the multiple semiconductor devices 100 are then packaged using known or later developed IC packaging techniques.

Figure 7:
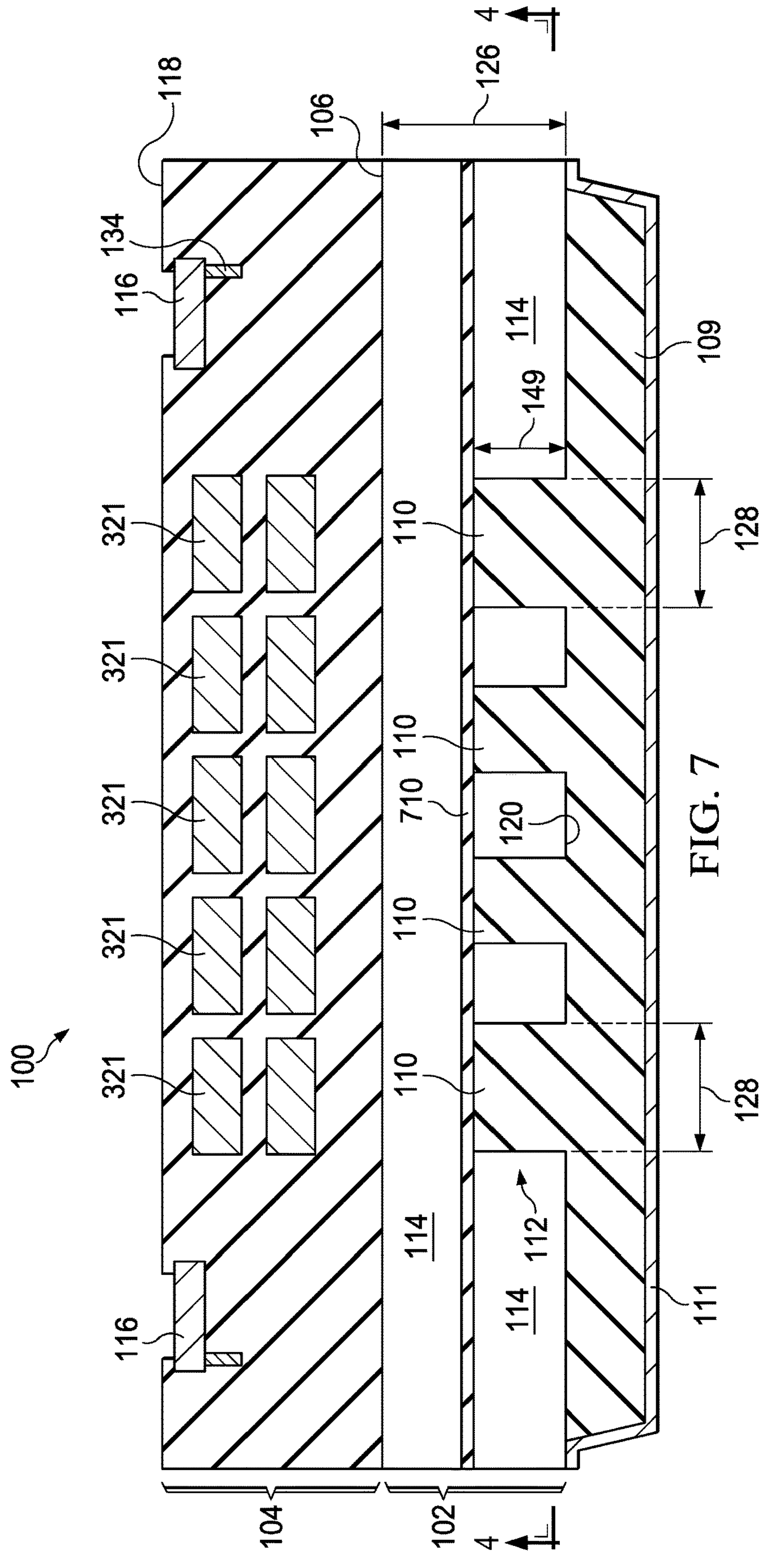
FIG. 7 is an example in which the through wafer trenches are provided to improve the Q factor of a passive component in a silicon-on-insulator wafer.

As described above, the Q-factor increasing technique for a passive component can be implemented in SOI-based wafers. FIG. 7 shows an example similar to that of FIG. 3, but for an SOI wafer. Insulator layer (e.g., a dielectric) 710 is shown separating the dielectric-filled trenches from the passive component(s) whose Q-factor is increased as described herein. In this description, the term “couple” may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Unless otherwise stated, “about,” “approximately,” or “substantially” preceding a value means +/−10 percent of the stated value.

Modifications are possible in the described embodiments, and other embodiments are possible, within the scope of the claims.

What is claimed is:

1. An integrated circuit (IC), comprising:

a semiconductor substrate having opposite first and second sides, the first side of the semiconductor substrate including a recess and a dielectric material in the recess;

an interconnect region on the second side of the semiconductor substrate, the interconnect region including one or more levels of metal lines; and a passive device on the second side of the semiconductor substrate, the passive device overlapping at least part of the recess.

2. The IC of claim 1, wherein the recess includes a trench extending from the first side into the semiconductor substrate.

3. The IC of claim 1, wherein the dielectric material includes a parylene compound.

4. The IC of claim 1, wherein the dielectric material includes a fluorinated parylene compound.

5. The IC of claim 1, wherein the recess includes a plurality of interconnected trenches, the plurality of interconnected trenches forming a grid pattern.

6. The IC of claim 1, wherein the recess includes a plurality of interconnected trenches, the plurality of interconnected trenches including concentric trenches and radial trenches extending outward from a center of the concentric trenches and through the concentric trenches.

7. The IC of claim 1, wherein the passive device includes at least one of a capacitor, inductor, or a transformer.

8. The IC of claim 2, wherein the semiconductor substrate is a first semiconductor substrate, the IC further comprises a second semiconductor substrate and a dielectric layer between the first and second semiconductor substrates, the second semiconductor substrate is between the passive device and the dielectric layer, and the trench terminates at the dielectric layer.

9. The IC of claim 2, wherein the dielectric material extends from the trench and covers the first side of the semiconductor substrate.

10. The IC of claim 1, further comprising a barrier layer on the first side covering the dielectric material.

11. The IC of claim 1, wherein the passive device is in the interconnect region and is coupled to the one or more levels of metal lines.

12. The IC of claim 1, further comprising a dielectric layer in the interconnect region, wherein the passive device and the one or more levels of metal lines are at least partially within the dielectric layer.

13. An integrated circuit (IC), comprising:

a semiconductor substrate having a first surface, and a second surface opposing the first surface;

a trench extending from the first surface towards the second surface of the semiconductor substrate;

a dielectric material in the trench; and a passive device over the second surface and opposing the first surface, the passive device overlapping with at least part of the trench.

14. The IC of claim 13, wherein the semiconductor substrate includes a plurality of interconnected trenches including the trench, the plurality of interconnected trenches forming a grid pattern.

15. The IC of claim 14, wherein the grid pattern includes orthogonally arranged trenches.

16. The IC of claim 13, wherein the semiconductor substrate includes a plurality of interconnected trenches including the trench, the plurality of interconnected trenches including concentric trenches and radial trenches extending outward from a center of the concentric trenches and through the concentric trenches.

17. The IC of claim 13, wherein the passive device includes at least one of a capacitor, an inductor, or a transformer.

18. The IC of claim 13, wherein the dielectric material includes a parylene compound.

19. The IC of claim 13, wherein the dielectric material includes a fluorinated parylene compound.

20. The IC of claim 13, further comprising a barrier layer on the first surface of the semiconductor substrate and covering the dielectric material.

21. The IC of claim 13, wherein the dielectric material extends from the trench and covers the first surface.

22. The IC of claim 13, wherein the dielectric material is a first dielectric material, and the IC further comprises an interconnect region over the second surface, the interconnect region including a dielectric layer and one or more levels of metal lines.

23. A method comprising:

forming a trench from a first surface of a semiconductor substrate, in which the semiconductor substrate has a second surface opposing the first surface;

depositing a dielectric material in the trench; and forming a passive device over the second surface or in the semiconductor substrate, in which the passive device opposes and overlaps at least partially with the trench.

24. The method of claim 23, further comprising forming a plurality of interconnected trenches including the trench from the first surface according to a grid pattern.

25. The method of claim 23, further comprising forming a plurality of interconnected trenches including the trench from the first surface, wherein the plurality of interconnected trenches includes concentric trenches and radial trenches extending outward from a center of the concentric trenches and through the concentric trenches.

26. The method of claim 23, wherein the passive device includes at least one of a capacitor, an inductor, or a transformer.

27. The method of claim 23, further comprising forming a dielectric layer on the second surface and the passive device.

28. The method of claim 23, wherein the dielectric material includes a dielectric polymer including at least one of a parylene compound or a fluorinated parylene compound.

29. The method of claim 28, further comprising baking the dielectric polymer.

30. The method of claim 29, further comprising forming a barrier layer over the dielectric polymer after the baking.

31. The method of claim 23, wherein the dielectric material is a first dielectric material, and the method further comprises forming layers of a second dielectric material and one or more levels of metal lines over the second surface.

* * * * *